United States Patent
Mooney et al.

(10) Patent No.: US 6,452,428 B1
(45) Date of Patent: Sep. 17, 2002

(54) SLEW RATE CONTROL CIRCUIT

(75) Inventors: Stephen R. Mooney; Joseph T. Kennedy, both of Beaverton; Chaiyuth Chansungsan; Prantik K. Nag, both of Hillsboro, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/448,048

(22) Filed: Nov. 23, 1999

(51) Int. Cl.[7] ............................................... H03K 17/16
(52) U.S. Cl. ........................... 327/108; 326/30; 326/86; 326/82
(58) Field of Search ................................ 327/108, 170; 326/30, 81, 82, 86

(56) References Cited

U.S. PATENT DOCUMENTS

| | | | |
|---|---|---|---|
| 4,797,631 A | 1/1989 | Hsu et al. | 330/253 |
| 4,958,133 A | 9/1990 | Bazes | 330/253 |
| 5,515,003 A | 5/1996 | Kimura | 330/253 |
| 5,532,630 A | * 7/1996 | Waggoner et al. | 327/108 |
| 5,602,509 A | 2/1997 | Kimura | 330/253 |
| 6,040,714 A | * 3/2000 | Klein | 327/30 |
| 6,137,360 A | 10/2000 | Memida | 330/253 |

OTHER PUBLICATIONS

Coban, A.L., et al., "A 1.75V rail–to–rail CMOS op amp", *1994 IEEE International Symposium on Circuits and Systems*, vol. 5 of 6, 497–500, (1994).

de Langen, K., et al., "Compact Low–Voltage Power–Efficient Operational Amplifier Cells for VLSI", *IEEE Journal of Solid–State Circuits*, vol. 33, 1482–1496, (Oct. 1998).

Sakurai, S., et al., "Robust Design of Rail–to–Rail CMOS Operational Amplifiers for a Low Power Supply Voltage", *IEEE Journal of Solid–State Circuits*, vol. 31, 146–156, (Feb. 1996).

* cited by examiner

*Primary Examiner*—Dinh T. Le
(74) *Attorney, Agent, or Firm*—Schwegman, Lundberg, Woessner & Kluth, P.A.

(57) ABSTRACT

A bi-directional communication system includes a driver capable of controlling a slew rate of transmitted data signals. Impedance matching can be provided to match an impedance of a driver circuit to an impedance of a communication line. The impedance is maintained constant as data is driven from the data driver. The data receiver circuit can adjust a reference voltage in response to simultaneously transmitted data. The slew rate of the receiver circuit trip point is controlled to maintain adequate noise margin during operation. Both the receiver and driver circuits can be controlled using a delay line circuit.

18 Claims, 4 Drawing Sheets

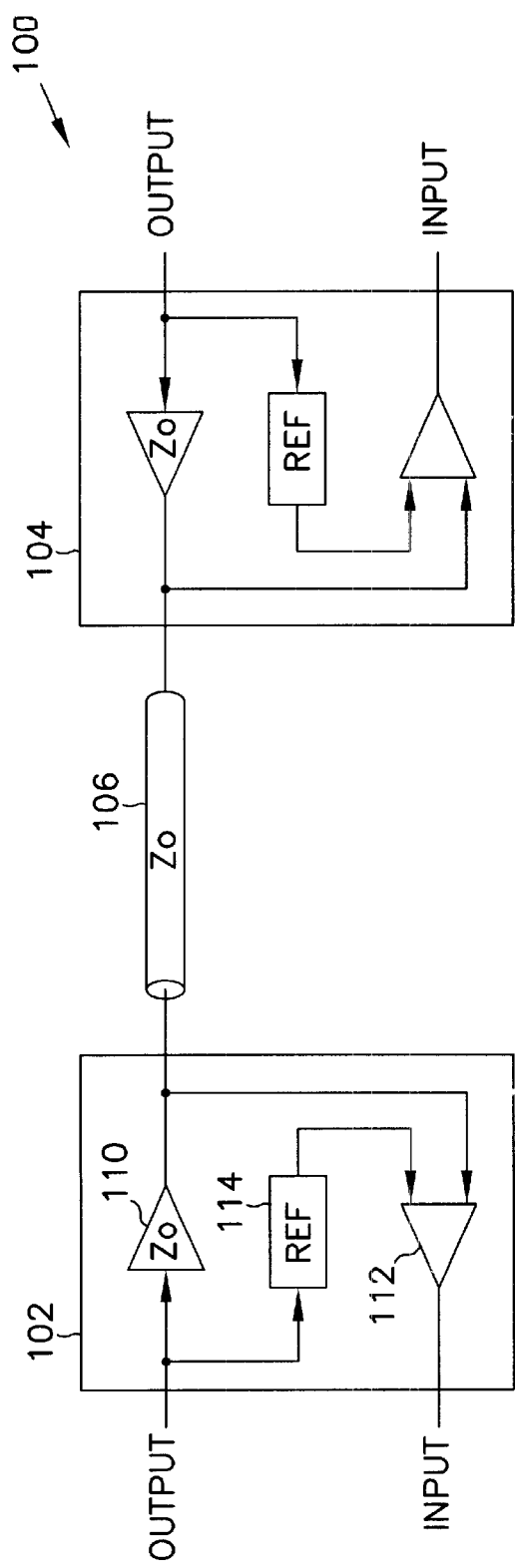

SLEW RATE CONTROL CIRCUIT

TECHNICAL FIELD OF THE INVENTION

The present invention relates generally to circuit output drivers and in particular the present invention relates to a circuit for controlling slew rates.

BACKGROUND OF THE INVENTION

Integrated circuits can be provided to communicate data over a communication bus. The integrated circuits include both a data transmitter, or driver circuit, and a receiver circuit. Communicating data signals on the communication bus can be complicated and is the subject of extensive studies relating to transmission lines. To reduce data signal ringing and signal interference, the rise time or slew rate of a signal transmitted on the data bus is often controlled. In addition, an impedance mismatch between the integrated circuit driver and the communication bus can increase the signal ringing and interference. As such, it is common to employ techniques to reduce impedance mismatch.

In addition to controlling data communication slew rate and driver circuit impedance matching, a reduction in the communication bus lines is desired. That is, two data lines can be provided between integrated circuits. One data line communicates in a first direction, while the second data line is used for data communication in an opposite second direction. It is desired to reduce the two data lines by using a single data communication line. By using a single data line which communicates data in two directions simultaneously, signal interference between the two data signals creates additional difficulties in reliable data communication. As such, reference circuitry can be used to subtract a data signal, which is being transmitted, from the data signal received to isolate the received data.

For the reasons stated above, and for other reasons stated below which will become apparent to those skilled in the art upon reading and understanding the present specification, there is a need in the art for a bidirectional data communication circuit which can provide slew rate control on transmitted data and maintain adequate noise margin on received data signals.

SUMMARY OF THE INVENTION

In one embodiment, a data communication circuit comprises a delay line circuit coupled to receive an output data signal. The delay line circuit includes a plurality of output connections for providing the output data signal, where a signal provided on each of the plurality of output connections is delayed from a previous one of the plurality of output connections. A data driver circuit is provided which comprises a plurality of stage circuits coupled to the plurality of output connections of the delay line circuit such that a slew rate of a data signal transmitted by the data driver circuit can be controlled by the delay line circuit. A data receiver circuit is coupled to the delay line circuit. A slew rate of a reference voltage signal coupled to the data receiver circuit can be controlled by the delay line circuit such that the slew rate of the data signal transmitted by the data driver circuit and the slew rate of a reference voltage signal are substantially the same.

In another embodiment, an integrated circuit is provided which comprises an output connection which can be coupled to an external data communication line, and a delay circuit having an input connection for receiving a data signal and a propagation path comprising a plurality of delay circuits. The delay circuit has a plurality of output connections located along the propagation path to provide digital output signals in response to the received data signal. A data driver circuit is coupled to the output connection and the plurality of output connections of the delay circuit. The data driver circuit comprises a plurality of stage circuits which can be selectively activated by the digital output signals to control a slew rate of an output data signal coupled to the output connection and maintain a constant impedance at the output connection while the data signal is transmitted. A data receiver circuit is provided which comprises a first input coupled to the output connection, a second input coupled to receive a first reference voltage signal, and a third input coupled to receive a second reference voltage signal. The data receiver circuit further comprises slew rate control circuitry coupled to the plurality of output connections of the delay circuit to control a slew rate of a trip point between the first and second reference voltage signals.

BRIEF DESCRIPTION OF THE DRAWINGS

FIG. 1 is a simplified block drawing of a communication system according to the present invention;

FIGS. 2a and 2b illustrate data transmission signals and receiver trip point voltage levels;

DETAILED DESCRIPTION OF THE INVENTION

Figure 3:
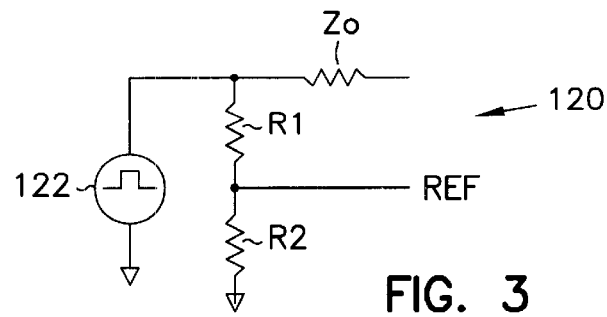
FIG. 3 illustrates an ideal controlled slew rate CMOS driver circuit.

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention allows control of a communication line driver slew rate, or transition time, for a digital communication system. By controlling the slew rate, the frequency content of signals on the communication system is limited, and driver circuit power delivery (di/dt) is controlled. As described in greater detail below, a digital circuit and method are provided for controlling a slew rate on a communication line, in combination with a digital impedance control scheme. An impedance of the driver circuit is controlled to remain relatively constant throughout the driver signal transition. Further, the slew rate of a driver circuit, and an input circuit reference level track each other such that simultaneous bi-directional signal communication can be performed on a common communication line.

Adjusting a slew rate of a driver circuit is affected by several system constraints. One constraint is the impedance differential between a driver circuit and the communication, or transmission line, which the driver circuit is coupled to. In some traditional circuits, source termination is provided to match an impedance of the driver circuit to the communication line. The impedance, however, needs to be maintained throughout the transition of a signal coupled to the communication line. That is, the impedance matching to the communication line should be maintained while controlling a slew rate of a signal transmitted on the communication line.

Referring to FIG. 1, a simplified block drawing of a communication system 100 according to the present invention is described. The system includes two communication circuits 102 and 104 which communicate over a common interconnect line 106. Each communication circuit includes a driver 110 and a receiver 112. The reference circuit is coupled to receive signals transmitted over the interconnect line and is coupled to a reference circuit 114 which provides a trip point to receiver 112. This configuration allows transmission of data simultaneously in both directions over the communication line. In order to decode the data, the trip point of the receiver is dynamically adjusted when outgoing data is provided. It is noted, that the impedance of the driver circuit should match the impedance of the communication line while the driver is switching output states. Further, the slew rate of the driver circuit should match the slew rate of the receiver circuit trip point to maintain an adequate noise margin for the receiver.

This is illustrated more clearly with reference to FIGS. 2a and 2b. FIG. 2a illustrates a system where data transmitted on a communication line transitions from a low state to a high state while the receiver circuit trip point transitions from a first reference voltage to a second reference voltage. Because the transition rate, or slew rate, of the two signals do not match, a noise margin during the transition period of the data approaches zero. In contrast, FIG. 2b illustrates a communication circuit where a receiver circuit trip point and a driver circuit slew rate match. As illustrated, a uniform noise margin (differential) is maintained between the two signals during simultaneous operation.

Prior to further describing the present invention, reference is made to FIG. 3 which illustrates an ideal controlled slew rate CMOS driver circuit 120. The circuit includes an ideal voltage source 122 coupled in series with a resistor of value Z0, which is equal to an impedance of the communication line which is coupled to the driver circuit. A voltage divider (R1 and R2) are connected to the same voltage source and provide the threshold voltage level, or trip point, of the receiver circuit. The circuit of FIG. 3 maintains a correct impedance throughout signal transitions, and the rate of change of the receiver's trip point matches the driver transition.

Figure 4:
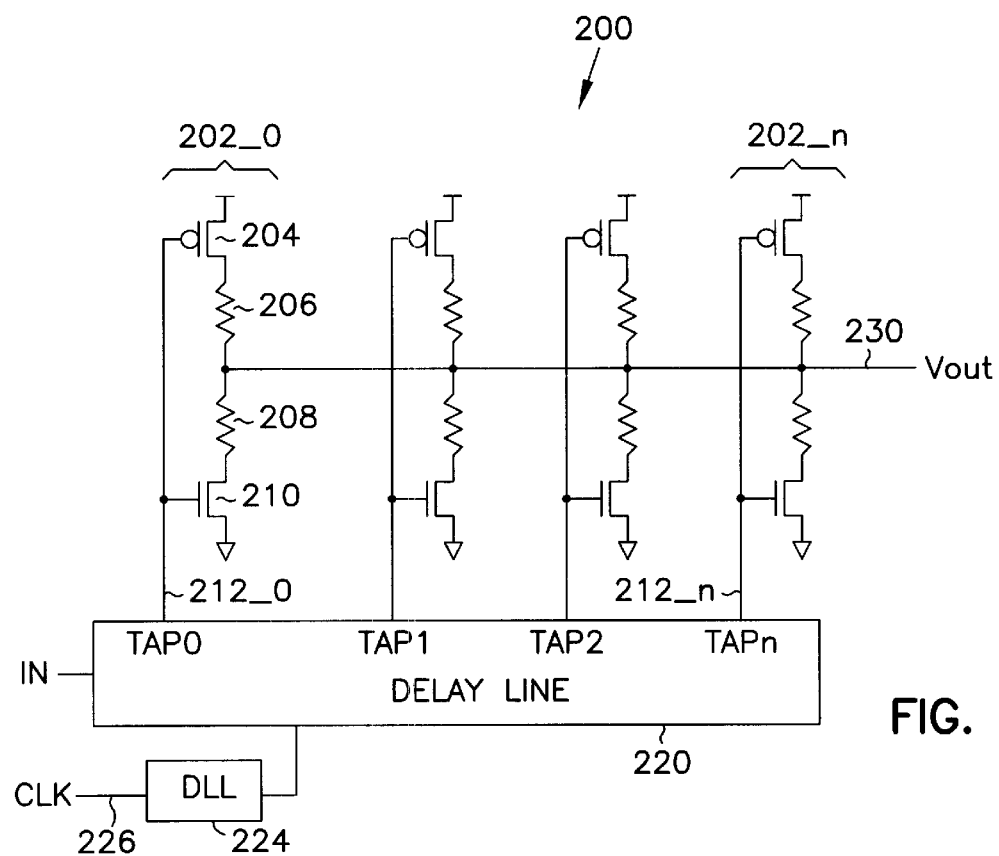
FIG. 4 illustrates a driver circuit which includes a slew rate control circuit system according to the present invention.

Referring to FIG. 4, a driver circuit 200 is illustrated which includes a slew rate control circuit. The driver circuit includes a plurality of push-pull driver circuits 202_0 to 202_n. Each push-pull driver circuit includes a pull-up transistor 204, a pull-up resistor 206, a pull-down resistor 208, and a pull-down transistor 210. The series resistors of each push-pull driver circuit have a resistance which is relatively large in relation to an impedance of the transistors. As such, the series coupled resistors 206 and 208 dominate the series impedance, and the push-pull driver circuit has good linearity from power rail to power rail. The resistors can be fabricated from any suitable structure, such as an N-well layer of a standard CMOS process.

Figure 5:
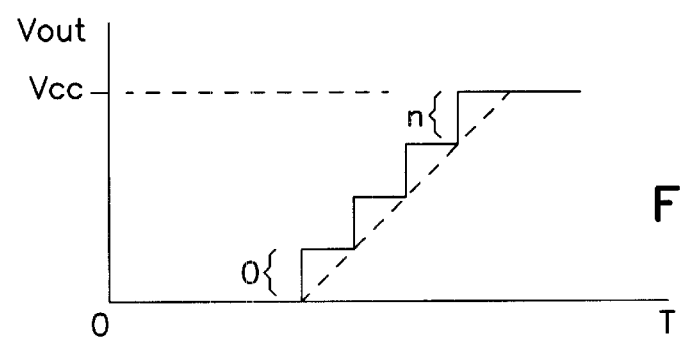
FIG. 5 illustrates an output signal provided by the driver circuit of FIG. 4.

The number of push-pull driver circuits provided in driver circuit 200 is determined by a number of taps provided by a delay line circuit 220. That is, delay line circuit 220 includes a plurality of delay stages which are tapped to provide a number of delayed signals. In the embodiment illustrated in FIG. 4, the delay line circuit has four taps. By controlling the delay time between each tapped signal, the driver circuit can approximate the ideal slew rate control circuit of FIG. 3. FIG. 5 illustrates an output signal provided by driver circuit 200 in response to a driver circuit input signal low to high transition. The output signal transitions from ground to VCC in a plurality of discrete steps. The number of steps corresponds to the number (n) of push-pull driver circuits provided in the driver circuit. The output signal can be filtered to provide a linear signal, as illustrated by a dotted line in FIG. 5.

Delay line 220 can be implemented in several ways. In one embodiment, the delay line can be implemented as a string of inverter circuits. This embodiment provides a resolution between consecutive tap output signals of two inverter delays. Two strings of inverters can be provided to achieve a resolution of one inverter, one driven by input data and the other driven by an inverse of the input data. In either embodiment, jitter may be experienced through the driver circuit that is close to jitter of a standard CMOS output circuit. To reduce this jitter, the delay line circuit can be coupled to receive a delay control signal from a delay locked loop circuit 224. The delay of the delay circuit, therefore, is locked to a clock signal and remains stable with respect to process, voltage, and temperature variations. Further, low-to-high and high-to-low signal transitions in the tap output signals are equal.

Figure 6:
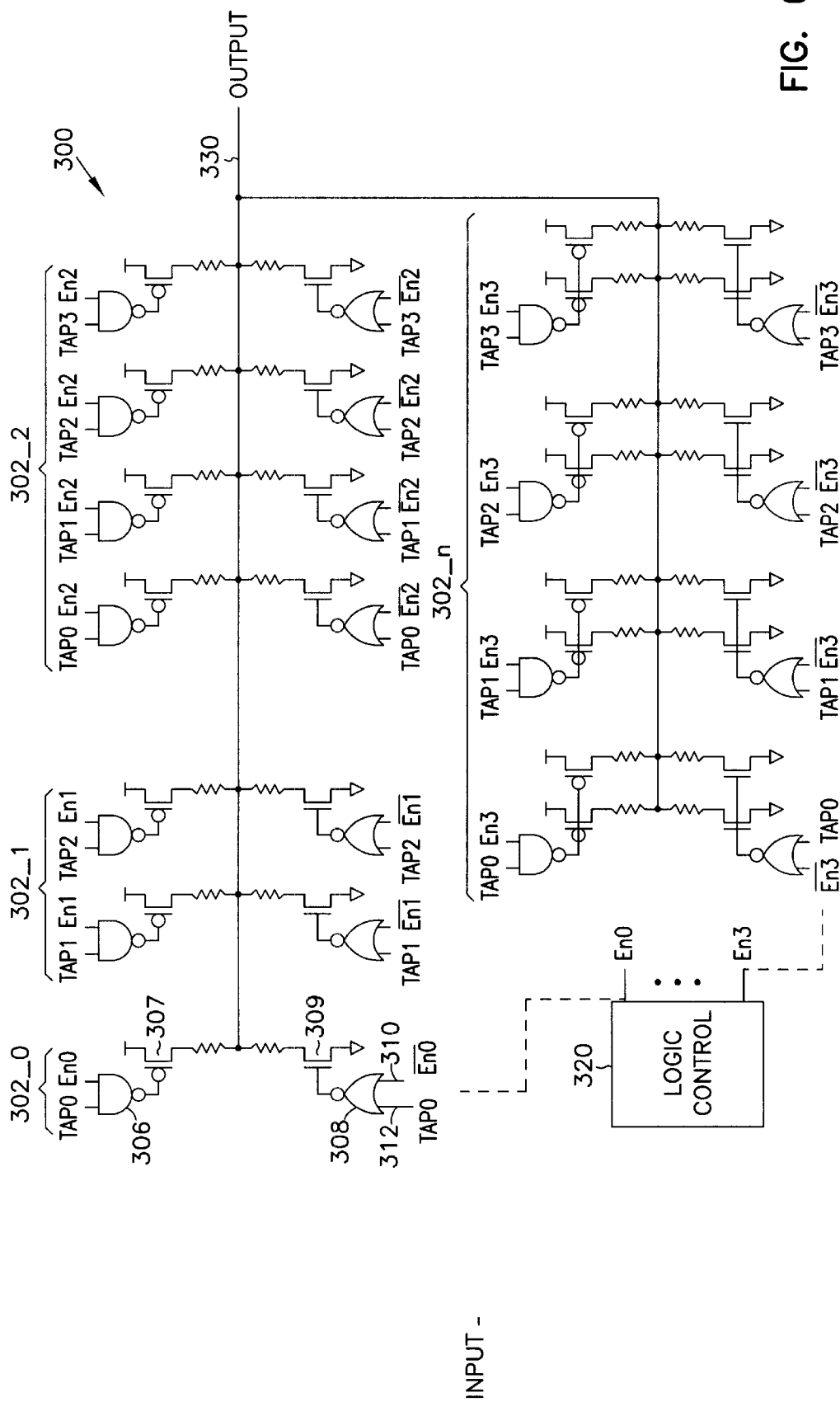
FIG. 6 illustrates a driver circuit which includes a digital impedance control circuit according to the present invention.

The above described driver circuit 200 provides a circuit and method for controlling slew rate of an output driver. As described with reference to FIG. 6, the outputs from delay line circuit 220 can be used to provide a driver circuit 300 which includes a digital impedance control circuit. Driver circuit 300 includes a plurality of binary weighted legs, and push-pull circuits as described above. The number of legs corresponds to the number of taps provided by delay line circuit 220. In the embodiment of FIG. 6, therefore, four legs 302_0 to 302_n are provided in the driver circuit. The impedance of the driver circuit is controlled by selectively changing the device width. To control the driver circuit, complementary enable signals (en_0 to e_n) are used to selectively enable legs of the circuit. Each leg is weighted using a unit size transistor segment which is replicated to form larger legs. That is, leg 302_0 comprises a single pull-up and pull-down transistor, and leg 302_1 comprises two pull-up and pull-down transistors. The third leg includes four transistors, and the fourth leg comprises eight transistors. As such, each leg increases in a binary fashion using unit size transistors. It will be appreciated, that the fourth leg can comprise four transistors which are weighted at 2× the unit transistor size.

Each leg of the driver circuit includes at least one push-pull circuit with linearizing resistors. Logic gates that respond to outputs from delay line circuitry 220 (FIG. 4) and enable signals provided by a control circuit 320 control the push-pull circuits. For example, leg 302_0 includes a NAND gate 306 which provides a control signal to the gate of pull up transistor 307. The logic gate is controlled in response to an enable signal, En0, and tap0 output from the delay line circuit. Likewise, a logic NOR gate 308 is provided to control pull-down transistor 309 in response to tap0 and an enable signal, /Enb0. Each leg of the driver circuit is controlled in response to the tap outputs of the delay line circuit. To provide a higher resolution in controlling both slew rate and impedance control, it is suggested to use as many taps as possible for each leg of the driver circuit. It is noted that the smaller legs, however, which comprise less than four segments, require a compromise using the delay line output circuit signals. In the embodiment illustrated, leg 302_1 is coupled to the middle two taps (tap_1, tap_2), while leg 302_0 is coupled to tap_0. In one embodiment, leg 302_0 can be filtered to be ¼ the bandwidth of the other legs. Alternately, the smaller legs can be divided into smaller segments which use all of the tap output signals, however, a minimum transistor size may prevent implementation of that embodiment.

The driver circuit of FIG. 6, therefore, provides both slew rate control and impedance matching by using a delay line circuit and logic enable circuitry. It will be appreciated by those skilled in the art after studying the present description that the sizes of the pull-up and pull-down transistors can be selected to fine-tune the incremental signal steps provided on the communication line output. In operation, control logic circuitry 320 sets the enable, and delay line 220 alternately disables a pull-up transistor and activates a pull-down transistor. Likewise, a pull-up transistor is enabled in sequence with disabling a pull-down transistor. By controlling the transistors in this manner, a more linear transition can be experienced on output connection 330 which is coupled to the external communication line.

Figure 7:
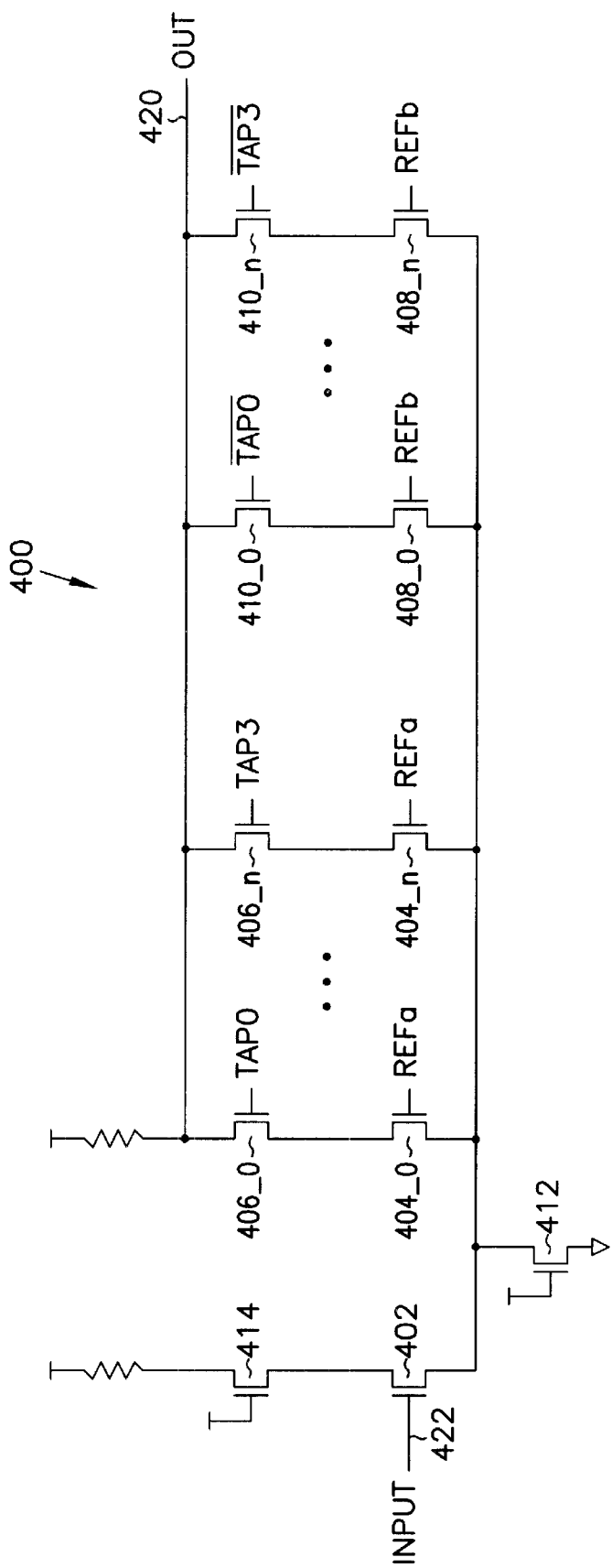
FIG. 7 illustrates a receiver circuit which includes reference circuit according to the present invention.

The above described driver circuits provide control over slew rate, and the combination of trip point slew rate and impedance matching. Referring to FIG. 7, a receiver circuit as described which includes reference circuitry that adjusts to compensate for data communicated by the driver circuit. The receiver circuit includes an input connection 422 coupled to the external data communication line 106 for receiving an input signal. The input signal is coupled to a gate connection of transistor 402. The receiver circuit is configured as a differential amplifier which receives a reference voltage signal on a gate connection of a reference transistor(s). In the embodiment illustrated, the receiver circuit includes a plurality of reference transistors 404_0- 404_n which receives a first reference voltage level, and a second plurality of reference transistors 408_0-408_n which receives a second reference voltage level. The different voltage levels are used as a reference voltage for the receiver, and depend upon a state of data which is being transmitted by the driver circuit. That is, Ref_a is used when the driver is transmitting a data zero, and Ref_b is used when the driver is transmitting a data one.

The reference transistors 404_0-404_n and 408_0- 408_n are coupled to transistors 406_0-406n and 410_0- 410_n, respectively. Transistors 406 are selectively activated by the tap outputs of the delay circuit. Transistors 410 are selectively activated using the complement of the tap outputs. The transistors are controlled so that when one of transistors 406 are turned off, one of transistors 410 is activated. Likewise, when a transistor 410 is tuned off, a transistor 406 is activated. This operation controls the slew rate of the receiver circuit trip point between two reference levels. It is noted that the combined size of transistors 406_0-406_n are equal to the size of transistor 414, and the combined size of transistors 410_0-410_n are also equal to the size of transistor 414. Likewise, the combined size of either transistors 404_0-404_n or 408_0-408_n are equal to the size of transistor 402. As such, the transition time of the trip point of the comparator is controlled by transistors 406 and 410 via the delay line circuit.

CONCLUSION

A bi-directional communication system has been described which includes a driver capable of controlling a slew rate of transmitted data signals. Circuitry has also been described which matches an impedance of a driver circuit to an impedance of a communication line. The impedance is maintained constant as data is driven from the data driver. A data receiver circuit of the system has been described which adjusts a reference voltage of the receiver in response to simultaneously transmitted data. The slew rate of the receiver circuit trip point between reference voltages is controlled to maintain adequate noise margin during operation. Both the receiver and driver circuits can be controlled using a delay line circuit.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. A data communication circuit comprising:
   a delay line circuit coupled to receive an output data signal, the delay line circuit includes a plurality of output connections for providing the output data signal, where a signal provided on each of the plurality of output connections is delayed from a previous one of the plurality of output connections;
   a data driver circuit comprising a plurality of stage circuits coupled to the plurality of output connections of the delay line circuit such that a slew rate of a data signal transmitted by the data driver circuit is controlled by the delay line circuit; and
   a data receiver circuit coupled to the delay line circuit, a slew rate of a receiver trip point of the data receiver circuit is controlled by the delay line circuit such that the slew rate of the data signal transmitted by the data driver circuit and the trip point slew rate are substantially the same.

2. The data communication circuit of claim 1 wherein the delay line circuit is coupled to a synchronous delay locked loop circuit, such that the delay locked loop circuit establishes a delay time between signals provided on the plurality of output connections.

3. The data communication circuit of claim 1 wherein the data driver circuit further comprises:
   a logic control circuit providing enable signals to the plurality of stages to maintain a constant impedance at an output connection of the data driver circuit during transitions of the data signal transmitted by the data driver circuit, wherein the plurality of stage circuits comprises a plurality of binary weighted stage circuits which are selectively activated in response to the delay line circuit.

4. The data communication circuit of claim 1 wherein the data receiver circuit comprises a differential amplifier coupled to receive first and second reference voltage signals, wherein the first reference voltage signal is used when the data driver circuit is transmitting a data signal having a first logic state, and the second reference voltage signal is used when but data driver circuit is transmitting a data signal having a second logic state.

5. A data communication circuit comprising:
   a delay line circuit coupled to receive an output data signal, the delay line circuit includes a plurality of output connections for providing the output data signal where a signal provided on each of the plurality of output connections is delayed from a previous one of the plurality of output connections;

a data driver circuit comprising a plurality of binary weighted push-pull circuits which are selectively activated in response to the delay line circuit and a logic control circuit to maintain a constant impedance at an output connection of the data driver circuit during transitions of the data signal transmitted by the data driver circuit, a slew rate of a data signal transmitted by the data driver circuit is controlled by selectively activating the plurality of binary weighted push-pull circuits; and a data receiver circuit coupled to the delay line circuit and comprising a differential amplifier coupled to receive first and second reference voltage signals, a trip point slew rate of a reference voltage signal coupled to the data receiver circuit is controlled by the delay line circuit such that the slew rate of the data signal transmitted by the data driver circuit and the trip point slew rate are substantially the same, and wherein the first reference voltage signal is used when the data driver circuit is transmitting a data signal having a first logic state, and the second reference voltage signal is used when but data driver circuit is transmitting a data signal having a second logic state.

6. The data communication circuit of claim 5 wherein the delay line circuit is coupled to a synchronous delay locked loop circuit, such that the delay locked loop circuit establishes a delay time between signals provided on the plurality of output connections.

7. An integrated circuit comprising:

an output connection to couple to an external data communication line;

a delay circuit having an input connection for receiving a data signal, a propagation path comprising a plurality of delay circuits, and a plurality of output connections located along the propagation path, the plurality of output connections providing digital output signals in response to the received data signal;

a data driver circuit coupled to the output connection and the plurality of output connections of the delay circuit, the data driver circuit comprising a plurality of stage circuits selectively activated by the digital output signals to control a slew rate of an output data signal coupled to the output connection and to maintain a constant impedance at the output connection while the data signal is transmitted; and a data receiver circuit comprising a first input coupled to the output connection, a second input coupled to receive a first reference voltage signal, and a third input coupled to receive a second reference voltage signal, the data receiver circuit further comprises slew rate control circuitry coupled to the plurality of output connections of the delay circuit to control a slew rate of a trip point between the first and second reference voltage signals.

8. The integrated circuit of claim 7 wherein each one of the plurality of stage circuits comprises;

a pull-up transistor coupled between an upper supply voltage connection and a first connection of a first resistor, the first resistor having a second connection coupled to the output connection; and a pull-down transistor coupled between a lower supply voltage connection and a first connection of a second resistor, the second resistor having a second connection coupled to the output connection, a gate connection of the pull-up transistor and the pull-down transistor are connected to one of the plurality of output connections of the delay circuit.

9. The integrated circuit of claim 7 further comprising a delay lock loop circuit coupled to the delay circuit to establish the delay time of the propagation path.

10. The integrated circuit of claim 7 wherein the plurality of stage circuits comprise one or more push-pull circuits that are binary weighted and selectively activated in response to the digital output signals and enable signals.

11. The integrated circuit of claim 7 wherein the delay circuit has N output connections, the data driver circuit comprises N stage circuits, and the slew rate control circuitry of the data receiver circuit comprises N stages to control the slew rate of the trip point between the first and second reference voltage signals.

12. The integrated circuit of claim 11 wherein N is equal to four.

13. A method of operating an integrated circuit data driver/receiver circuit, the method comprising:

providing a plurality of binary control signals using a delay line circuit in response to an output signal;

adjusting a slew rate of the output signal provided by an output driver circuit using the plurality of binary control signals; and adjusting an impedance of an output connection of the output driver circuit using the plurality of binary control signals such that a constant impedance is maintained during signal transitions of the output signal.

14. The method of claim 13 further comprising:

adjusting a slew rate of a receiver circuit trip point to maintain a substantially uniform noise margin between the output signal and receiver circuit trip point.

15. The method of claim 13 wherein a propagation path of the delay line circuit is controlled using a delay lock loop circuit.

16. The method of claim 13 wherein the output driver circuit comprises a plurality of binary weighted stages each comprising at least one push-pull circuit.

17. The method of claim 16 wherein adjusting an impedance of an output connection of the output driver circuit includes selectively enabling the plurality of binary weighted stages.

18. The method of claim 16 wherein the push pull circuit comprises a pull-up transistor, a pull-down transistor, and first and second linearizing resistors respectively coupled between the pull-up and pull-down transistors and the output connection.

* * * * *